(12) United States Patent
Takaki et al.

(10) Patent No.: US 8,344,651 B2
(45) Date of Patent: Jan. 1, 2013

(54) LIGHT CONTROL APPARATUS AND LIGHTING APPLIANCE USING THE SAME

(75) Inventors: Hirofumi Takaki, Aichi (JP); Shin Ukegawa, Kyoto (JP); Minoru Maehara, Osaka (JP); Hirofumi Konishi, Osaka (JP); Masanao Okawa, Nara (JP)

(73) Assignee: Panasonic Corporation, Osaka (JP)

( * ) Notice: Subject to any disclaimer, the term of this patent is extended or adjusted under 35 U.S.C. 154(b) by 429 days.

(21) Appl. No.: 12/679,717

(22) PCT Filed: Sep. 24, 2008

(86) PCT No.: PCT/JP2008/067191
§ 371 (c)(1),
(2), (4) Date: May 11, 2010

(87) PCT Pub. No.: WO2009/041438
PCT Pub. Date: Apr. 2, 2009

(65) Prior Publication Data
US 2010/0219768 A1    Sep. 2, 2010

(30) Foreign Application Priority Data

Sep. 25, 2007    (JP) ................. 2007-248105

(51) Int. Cl.
H05B 37/02    (2006.01)
H05B 39/04    (2006.01)
H05B 41/36    (2006.01)
H05B 37/00    (2006.01)
H05B 39/00    (2006.01)
H05B 41/14    (2006.01)
H05B 41/16    (2006.01)
H05B 41/24    (2006.01)

(52) U.S. Cl. .................... 315/291; 315/200 R; 315/246; 315/297

(58) Field of Classification Search .................. None
See application file for complete search history.

(56) References Cited

U.S. PATENT DOCUMENTS 6,473,064 B1    10/2002    Tsuchida et al.
(Continued)

FOREIGN PATENT DOCUMENTS

JP    61-117598    6/1986
(Continued)

OTHER PUBLICATIONS

U.S. Appl. No. 12/679,688 to Takaki et al., which was filed on Mar. 24, 2010.
(Continued)

*Primary Examiner* — Douglas W Owens
*Assistant Examiner* — Dedei K Hammond
(74) *Attorney, Agent, or Firm* — Greenblum & Bernstein, P.L.C.

(57) ABSTRACT

It is an object to provide a light control apparatus and a lighting appliance using the same which enables to increase luminous efficiency in the light control. The lighting appliance includes a light source and a light control apparatus. The light control apparatus includes an electric current output circuit which outputs a constant electric current for lighting to a light source configured of an organic electroluminescence device, an electric current control circuit which controls an intensity of a driving electric current outputted from the electric current output circuit, and the electric current control circuit biases a direct current component so as to vary the driving electric current periodically between a predetermined maximum value and a predetermined minimum value and flows in the same direction at all times in the light control of the light source.

12 Claims, 9 Drawing Sheets

U.S. PATENT DOCUMENTS

| | | |
|---|---|---|
| 7,781,982 B2 * | 8/2010 | Tatsumi ........................ 315/291 |
| 2007/0145902 A1 | 6/2007 | Yaguchi et al. |
| 2007/0170873 A1 | 7/2007 | Mishima |
| 2008/0030143 A1 | 2/2008 | Goriki et al. |
| 2008/0185971 A1 | 8/2008 | Kinoshita |
| 2009/0212715 A1 | 8/2009 | Maehara |
| 2010/0013393 A1 | 1/2010 | Onishi et al. |
| 2010/0033692 A1 | 2/2010 | Watanabe et al. |
| 2010/0039581 A1 | 2/2010 | Mishima et al. |

FOREIGN PATENT DOCUMENTS

| | | |
|---|---|---|
| JP | 07-230880 | 8/1995 |
| JP | 9-212128 | 8/1997 |
| JP | 2000-285708 | 10/2000 |
| JP | 2003-243157 | 8/2003 |
| JP | 2004-245904 | 9/2004 |
| JP | 2004-361737 | 12/2004 |
| JP | 2005-149744 | 6/2005 |
| JP | 2006-065063 | 3/2006 |
| JP | 2006-210848 | 8/2006 |
| WO | 2005/106835 | 11/2005 |

OTHER PUBLICATIONS

Search report from May 3, 2012, mail date is E.P.O.

* cited by examiner

LIGHT CONTROL APPARATUS AND LIGHTING APPLIANCE USING THE SAME

TECHNICAL FIELD

The present invention relates to a light control apparatus for lighting an organic electroluminescence device and a lighting appliance using the same.

BACKGROUND ART

In recent years, an organic electroluminescence (Organic Electro-Luminescence, it is called "organic EL") device attracts attention as a light emitting device. The organic electroluminescence device (hereinafter, it is abbreviated as "organic EL device") has a characteristic of superior response because a time from start up of power distribution to light emission is very short and brightness instantly varies by varying electric current. In addition, the organic EL device has characteristics that the response hardly varies with temperature, and an angle of field of view thereof is near to 180 degrees. Due to these characteristics, the organic EL device is suitable to surface emission, and thus, it is utilized to a lighting appliance such as a backlight of a liquid crystal display apparatus, recently.

As for a light control apparatus for the organic El device, one having light control function to control the brightness (brilliance) of the organic EL device is proposed as described in JP2006-210848A or JP2004-245904A, for example. FIG. 8 shows a circuit diagram of a lighting appliance which comprises a light source 1 consisting of an organic EL device and a light control apparatus 2 for lighting the light source 1. The light control apparatus 2 feeds a constant electric current of a predetermined value to the light source 1 consisting of the organic EL device, and comprises a rectification circuit 3 consisting of a diode bridge to perform full wave rectification to an alternating electric current which is an output of an alternator AC such as a commercial power source, a power-factor correction circuit unit (hereinafter, it is abbreviated as "PFC circuit") 4 which converts the alternating electric current output performed the full-wave rectification by the rectification circuit 3 to a direct electric current output, an electric current output circuit 5 which outputs a constant electric current for lighting the light source 1 on the basis of the direct electric current output from the PFC circuit 4, and a light control circuit 7 which performs light control of the light source 1 by intermittently feeding the constant electric current outputted from the electric current output circuit 5 to the light source 1.

The PFC circuit 4 has a coil (a choke coil) L1, an end of which is connected to an output terminal of a high electric potential side of the rectification circuit 3. A series circuit of a switching element Q1 such as a MOSFET of n-channel type and a resistor R1 is set between another end of the coil L1 and an output terminal of a low electric potential side of the rectification circuit 3. An anode of a diode D1 for preventing counter electric current is connected to a connection point of the coil L1 and the switching element Q1. A smoothing capacitor C1 such as an electrolytic capacitor is set between a cathode of the diode D1 and the output terminal of the low electric potential side of the rectification circuit 3.

In such PFC circuit 4, when switching on the switching element Q1, an electric current flows from the output terminal of the high electric potential side of the rectification circuit 3 through the coil L1 and the switching element Q1, so that an energy is accumulated in the coil L1. Subsequently, when switching off the switching element Q1, the energy accumulated in the coil L1 is supplied to the smoothing capacitor C1 through the diode D1. By repeating switching on and off of the switching element Q1, feeding and cutting off of the electric current to the capacitor C1 is repeated. By performing the on/off control of the switching element Q1 with a high frequency, a voltage between both terminals of the capacitor C1 can be set to a desired value.

The switching element Q1 is ON/OFF controlled by a PFC control unit 4a. The PFC control unit 4a detects presence or absence of an electric current flowing in the coil L1 by a coil L2 and detects a source voltage of the switching element Q1, and performs the ON/OFF control of the switching element Q1 based on the detected value of the electric current so as to maintain the voltage between the both terminals of the capacitor C1 constant. In addition, the PFC control unit 4a comprises a power-factor correction function to correct distortion of harmonic component of the electric current obtained from the alternator AC, and sets an ON term of the switching element Q1 to correct the power-factor of input of the alternator AC, for example.

The electric current output circuit 5 is a depression chopper circuit which depresses a voltage of the direct electric current output of the PFC circuit 4, and comprises: a switching element Q2 such as a MOSFET of n-channel type, a drain of which is connected to the high electric potential side of the smoothing capacitor C1 of the PFC circuit 4; a coil L3, an end of which is connected to a source of the switching element Q2; a diode D2 for backflow, an anode of which is connected to the low electric potential side of the smoothing capacitor C1; a smoothing capacitor C2 such as an electrolytic capacitor connected to another end of the coil L3; a resistor R2 set between the low electric potential side of the capacitor C2 and an anode of the diode D2; and an electric current control circuit 6 which performs ON/OFF control of the switching element Q2. By performing the ON/OFF control of the switching element Q2, the electric current output circuit 5 can set a voltage between both ends of the capacitor C2, that is, the voltage applied to both ends of the light source 1 to a desired value. The electric current control circuit 6 performs the ON/OFF control of the switching element Q2 based on a voltage between both ends of the resistor R2 so as to make the voltage between the both ends of the smoothing capacitor C2 constant, and thus, the electric current output circuit 5 outputs a constant electric current to the light source 1. The electric current output circuit 5 and the electric current control circuit 6 constitute a constant current source.

The light control circuit 7 is configured of a switching element Q3 such as a MOSFET of n-channel type, a drain of which is connected to a high electric potential side of the capacitor C2 of the electric current output circuit 5 and a light control unit 7a which performs the ON/OFF control of the switching element Q3. The light control unit 7a performs the ON/OFF control of the switching element Q3 in a high frequency by applying voltages to a gate of the switching element Q3 as shown in FIG. 9A based on a given duty ratio. Consequently, electric currents are intermittently outputted to the light source 1 as shown in FIG. 9B, so that light control of the light source 1 is performed.

By the way, an equivalent circuit of the organic EL device which is the light source 1 is represented by a parallel circuit of a diode and a capacitor. In other words, the organic El device is a capacitive load having a capacitive component. Therefore, when feeding of electric power to the light source 1 is started by switching on the switching element Q3 in the light control apparatus 2 of the conventional case, a surge electric current (a charge electric current) flows in the organic EL device to charge the capacitive component of the organic EL device, so that stress is given to the organic EL device (hatched regions designated by symbols P1 in FIG. 9B). In addition, since the organic EL device does not emit light until the capacitive component is charged, rising-up of light flux outputted from the light source 1 is delayed. On the other hand, when the switching element Q3 is switched off and feeding of electric power to the light source 1 is stopped, electric charge accumulated in the capacitive component of the organic EL device is discharged (hatched regions designated by symbols P2 in FIG. 9B). Therefore, a surge electric current flows to charge the capacitive component of the organic EL device again, when the switching element Q3 is switched on subsequently.

In this way, since charge and discharge of the capacitive component of the organic EL device serving as the light source 1 are performed when the switching element Q3 is switched on and off, electric power supplied to the light source 1 is consumed wastefully, and luminous efficiency becomes worse. Such problems are significant when the switching element Q3 is switched on and off in a high frequency.

DISCLOSURE OF INVENTION

The present invention is conceived to solve the above mentioned problems in the prior art, and a purpose of the invention is to provide a light control apparatus and a lighting appliance using the same, which enables to improve luminous efficiency in light control.

A light control apparatus in accordance with an aspect of the present invention comprises: an electric current output circuit which outputs a constant electric current for lighting a light source configured of an organic electroluminescence device; and an electric current control circuit for controlling an intensity of a driving electric current outputted from the electric current output circuit, wherein the electric current control circuit biases a direct electric current component so that the driving electric current periodically varies between a predetermined maximum value and a predetermined minimum value and flows in the same direction at all times in light control of the light source.

In addition, a lighting appliance in accordance with an aspect of the present invention comprises the above light control apparatus and a light source configured of an organic electroluminescence device.

According to such configurations, since the driving electric current flows in the same direction at all times to the light source, that is, the organic EL device in the light control, when a capacitive component of the organic EL device is once charged, it is never discharged until the completion of the light control, and thus, loss of electric power supplied to the light source becomes small and luminous efficiency can be increased. In addition, since charge and discharge to the organic EL device are not performed in the light control, the luminous efficiency thereof can be increased. Moreover, since the light source is never extinguished in the light control, the brightness of the organic EL device immediately varies responding to the variation of the driving electric current, and thus, rising-up of light flux of the light source can be made precipitous, brightness of light emission of the lighting appliance using this light control apparatus can be increased, and flicker of the light source can be decreased. Moreover, surge electric currents due to charge and discharge of the capacitive component do not flow repeatedly in the organic EL device, so that stress loaded on the organic EL device is reduced and an operation life of the light source can be elongated. Moreover, since the light control of the light source is performed by periodically oscillating the driving electric current between the predetermined maximum value and the predetermined minimum value, a circuit for PWM control such as a switch for switching on and off a feeding line between the electric current output circuit and the light source and a control unit for controlling the switch becomes unnecessary, and thus, it is possible to simplify a circuit configuration and to reduce a cost thereof.

BEST MODE FOR CARRYING OUT THE INVENTION

First Embodiment

Figure 1:
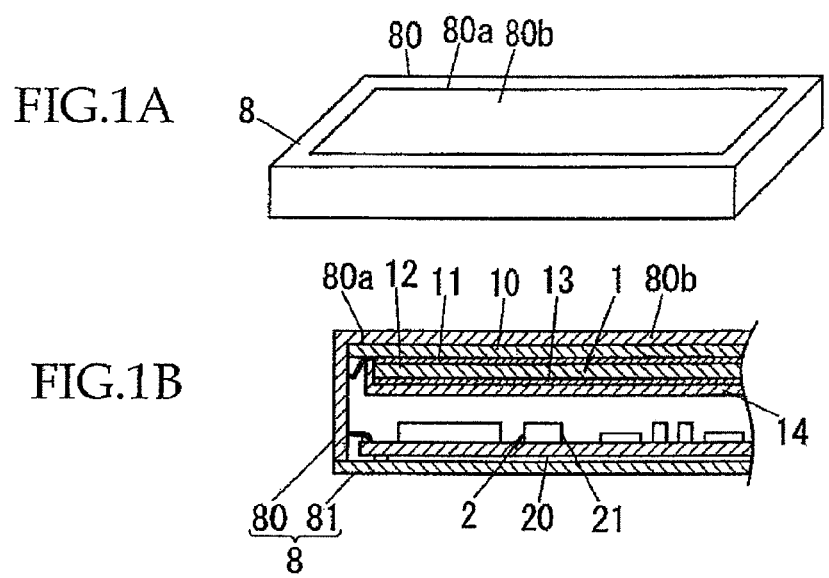
FIG. 1A is a perspective illustration showing an appearance of a lighting appliance in accordance with a first embodiment of the present invention.
FIG. 1B is a cross sectional illustration showing an inside constitution of the above lighting appliance.

A light control apparatus and a lighting appliance using the same in accordance with a first embodiment of the present invention are described with reference to figures. FIG. 1A is a perspective illustration showing an appearance of the lighting appliance, and FIG. 1B is a cross sectional illustration showing an inside constitution thereof. As shown in the figures, the lighting appliance comprises a light source 1 configured of an organic EL device, a light control apparatus 2 to control lighting of the light source 1 and a casing 8 for containing the light source 1 and the light control apparatus 2.

The light source 1 comprises a supporting board 10, a transparent electrode 11 formed on a first face (lower face in the figure) side of the supporting board 10, a light emission layer 12 formed on a surface (lower face) among the surfaces of the transparent electrode 11 opposite to the supporting board 10, a reflection electrode 13 formed of a metal on a surface (lower face) among the surfaces of the light emission layer 12 opposite to the transparent electrode 11, and a sealing member 14 provided to cover the transparent electrode 11, the light emission layer 12 and the reflection electrode 13 from the first face (lower face) of the supporting board 10.

The supporting board 10 is a flat-shaped member for supporting the light emission layer 12 and formed of a material having transparency to lights emitted from the light emission layer 12. As for the supporting board 10, a transparent board such as a glass board is used. The transparent electrode 11 is an electroconductive thin film formed of a material having transparency to the lights emitted from the light emission layer 12. As for the material of such transparent electrode 11, a transparent conductive material such as ITO (Indium Tin Oxide) is used. The light emission layer 12 is formed of an organic material of fluorescent material or an organic material including fluorescent material, for example, and comprises a positive hole injection layer, a positive hole transportation layer, an electron transportation layer and an electron injection layer are provided, if necessary. The reflection electrode 13 is an electroconductive thin film formed of a material which reflects the lights emitted from the light emission layer 12. As for the material of such reflection electrode 13, aluminum, aluminum-lithium alloy, or magnesium-silver alloy is used, for example.

By the way, terminal portions (not illustrated) for feeding electric power are provided on the transparent electrode 11 and the reflection electrode 13. The sealing member 14 is air-tightly attached to the first face (lower face) side of the supporting board 10 with an adhesive or the like so that the terminal portions of the transparent electrode 11 and the reflection electrode 13 are exposed. The sealing member 14 is formed to be a box-shape a face of which is opened with an insulative material such as a glass, and used to prevent deterioration of the light emission layer 12 formed of the organic material due to influence of oxygen or humidity, gradually.

In this way, the light source 1 is an organic EL device of a rectangular plate shape which is constituted by building up of the transparent electrode 11, the light emission layer 12 and the reflection electrode 13 sequentially, and when a predetermined voltage is applied between the transparent electrode 11 and the reflection electrode 13 through the terminal portions for feeding electric power (generating electric potential difference), lights are emitted from the light emission layer 12.

The lights emitted from the light emission layer 12 toward the transparent electrode 11 side pass through the transparent electrode 11, subsequently enter into the supporting board 10, pass through an inside of the supporting board 10 and exit from a second face (upper face) side of the supporting board 10 to outside of the supporting board 10. On the other hand, the lights emitted from the light emission layer 12 toward the reflection electrode 13 side are reflected by the reflection electrode 13 toward the transparent electrode 11 side, subsequently pass through the inside of the supporting board 10 and exit from the upper face side of the supporting board 10 to outside of the supporting board 10.

Considering manufacturing process of building up the transparent electrode 11, the light emission layer 12 and the reflection electrode 13 sequentially and adhering the sealing member 14 on the supporting board 10, the light source 1 is an organic EL device of single-sided emission type in which the second face (bottom face in the manufacturing process) of the supporting board 10 is light emitting face and the face (upper face in the manufacturing process) among the surfaces of the sealing member 14 opposite to the supporting board 10 is non-light emission face, and especially bottom emission type one which emits lights toward the bottom face of the supporting board 10.

The casing 8 is constituted by a body 80 of box-shape, a lower face of which is opened, and a cover 81 which is to be attached to the body 80 to cover the opening of the lower face, as shown in FIG. 1B. The body 80 and the cover 81 are formed of aluminum, for example. A window aperture 80a, from which the lights emitted from the light source 1 exit to outside of the casing 8, is formed on a ceiling of the body 80. In addition, the window aperture 80a is closed by a transparent cover 80b which is formed of a material (for example, a glass) having transparency to the lights emitted from the light source 1. The light source 1 is adhered from the inside of the box-shaped body 80 so that the light emitting face (the second face of the supporting board 10) faces the transparent cover 80b fitted to the window aperture 80a. Thus, an outer face of the transparent cover 80b serves as a light emitting face of the casing 8. A printed circuit board 20 of the light control apparatus 2 is attached to an inner face of the cover 81, and the cover 81 is attached to the body 80 in a manner so that the light control apparatus 2 is disposed between the light source 1 and the cover 81 in an inner space of the body 80. In addition, the light control apparatus 2 and the light source 1 are electrically connected by wire bonding or the like.

Figure 2:
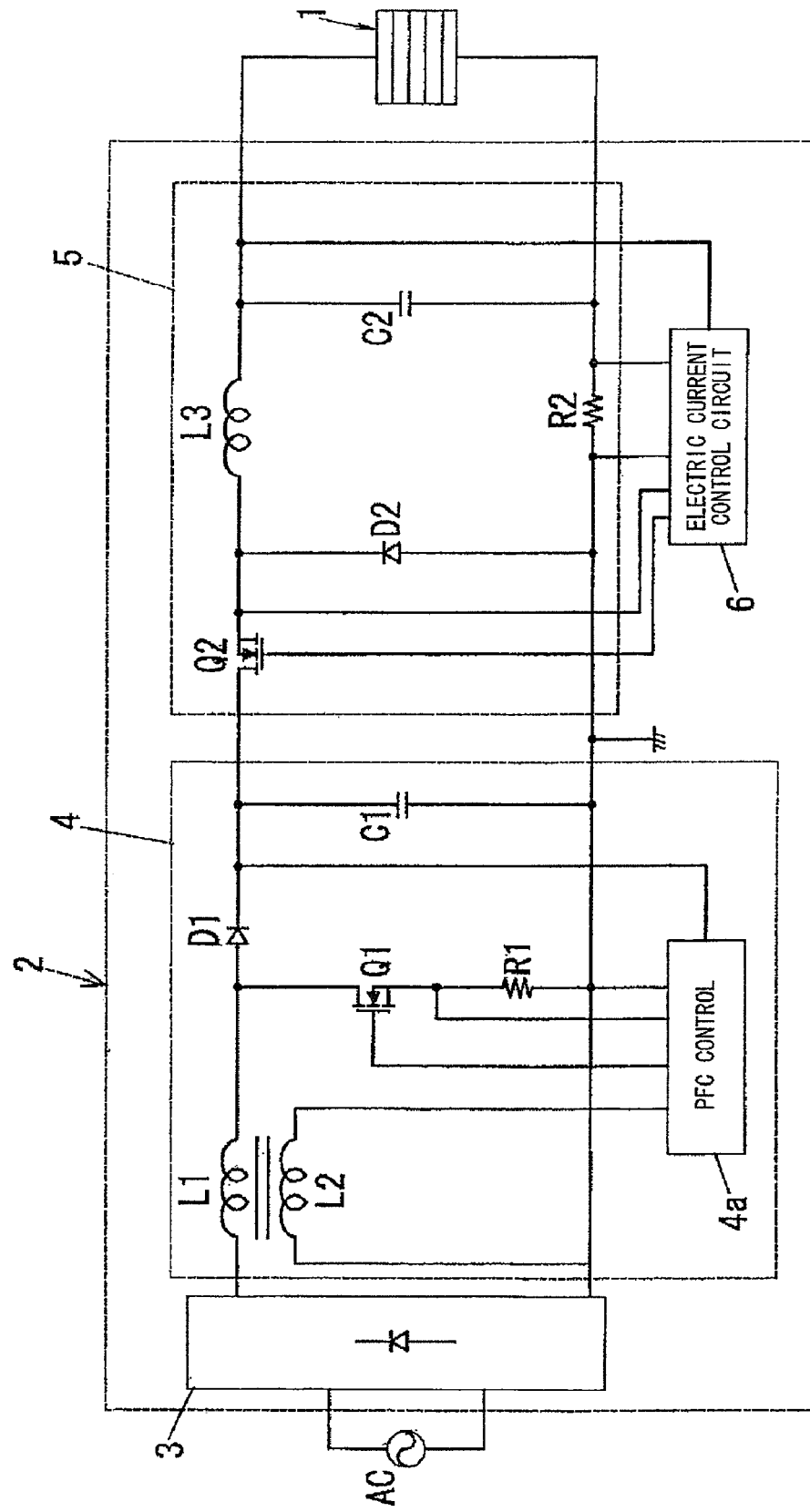
FIG. 2 is a circuit diagram showing a constitution of a light control apparatus 2 in the first embodiment.

The light control apparatus 2 in the first embodiment is constituted that electronic elements 21 constituting a lighting circuit for controlling lighting of the light source 1 are mounted on the printed circuit board 20, and has a circuit constitution shown in FIG. 2, for example. The circuit constitution of the light control apparatus 2 is described below with reference to FIG. 2 to FIG. 4.

The light control apparatus 2 in the first embodiment has a rectification circuit 3, a PFC circuit 4, an electric current output circuit 5 and an electric current control circuit 6, however, it is different from the above mentioned conventional one in terms of not having a light control circuit 7 and constituted to flow an electric current to the light source 1 directly from the electric current output circuit 5. In addition, since constitutions of the rectification circuit 3 and the PFC circuit 4 are the same as those of the conventional ones, description of them is omitted.

Figure 3:
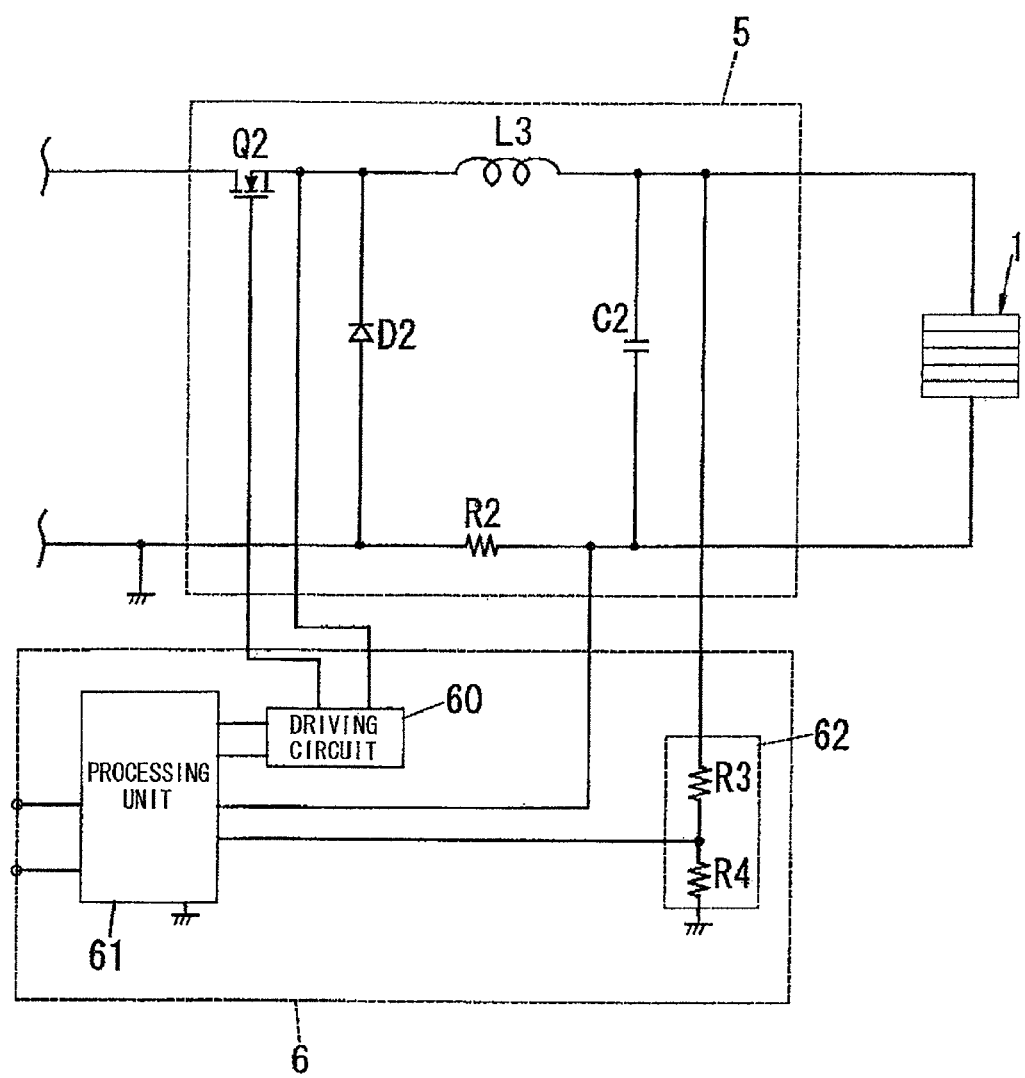
FIG. 3 is a circuit diagram showing a concrete constitution of an electric current control circuit 6 of the light control apparatus in the first embodiment.

As shown in FIG. 3, the electric current control circuit 6 is constituted by a driving circuit (driving IC) 60 which performs ON/OFF control of a switching element Q2, a processing unit 61 for controlling the driving circuit 60 by outputting driving signals to the driving circuit 60, and a voltage dividing circuit 62 which is constituted by a series circuit of a resistor R3 and a resistor R4 for detecting a voltage between both ends of a capacitor C2.

The driving circuit 60 varies a voltage between both ends of a capacitor C2, that is, an intensity of a driving electric current outputted from the electric current output circuit 5 by performing the PWM control of a switching element Q2. A duty ratio of the switching element Q2 is defined by the intensity (a voltage of a signal) of the driving electric current outputted from the processing unit 61. In addition, a switching frequency of the switching element Q2 is set to be several tens kHz.

The processing unit 61 monitors the voltage (that is, the driving electric current) between both ends of the resistor R2 through which the driving electric current flows in the electric current output circuit 5, and outputs the driving signals to the driving circuit 60 so that the voltage between both ends of the resistor R2 becomes a predetermined value.

The processing unit 61 has a light control function for performing light control of the light source 1 by oscillating the driving current to be a value that a minimum value thereof becomes higher than "0" even when it shows the minimum value, in other words, by oscillating sinusoidal waves or rectangular waves to be biased a direct current component. Specifically, the processing unit 61 outputs the driving signals to the driving circuit 60 to appear a term t1 and a term t2 during which the duty ratio of the switching element Q2 becomes w1 and w2 alternately, as shown in FIG. 4C. Hereupon, the voltage between both ends of the resistor R2 becomes a voltage V1 in the term t1 and the voltage between both ends of the resistor R2 becomes a voltage V2 in the term t2, as shown in FIG. 4B. In other words, the voltage V2 corresponds to a biasing direct current component.

The maximum value I1 of the driving electric current shown in FIG. 4 is defined by a value of the resistor R2 and the voltage V1, and it is selected to be about 0.3 A, as an example, which is a value not to give any stress to (not to affect the operative life of) the organic EL device of the light source 1. In addition, the minimum value I2 (I2<I1) of the driving electric current is defined by the value of the resistor R2 and the voltage V2, and it is selected to be about 50 mA (more preferably, equal to or larger than 100 mA), as an example, which is a value equal to or larger than the smallest value of the electric current enabling to maintain the lighting of the light source 1. In addition, the values such as 0.3 A, 50 mA and 100 mA are merely the examples because these values may be varied due to characteristics of the light source 1 (characteristics of the organic EL device), and thus, the maximum value I1 and the minimum value I2 of the driving electric current are not limited to these values.

Figure 4A:
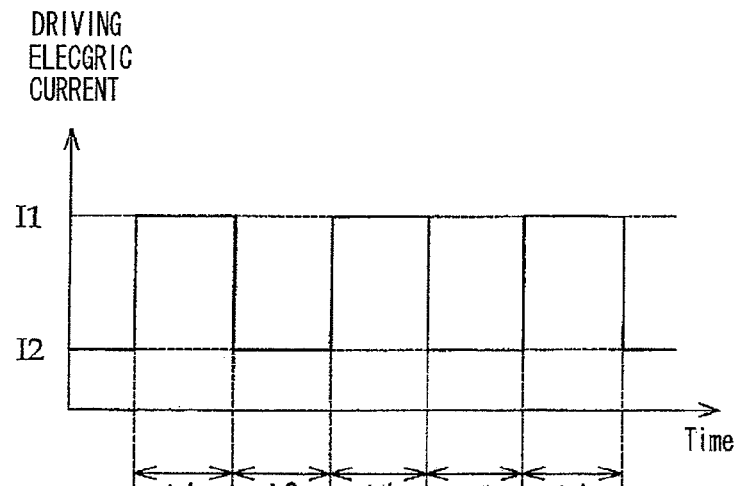
FIG. 4A is a timing chart showing a variation of a driving electric current flowing in a light source 1.
Figure 4B:
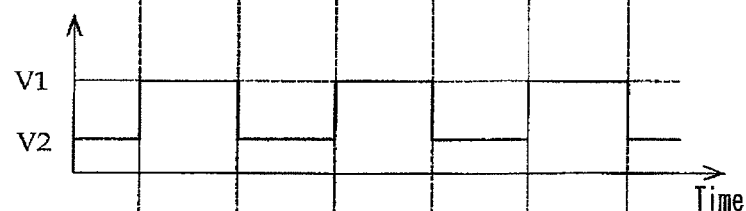
FIG. 4B is a timing chart showing a variation of a voltage between both ends of a resistor R2 in FIG. 3.
Figure 4C:
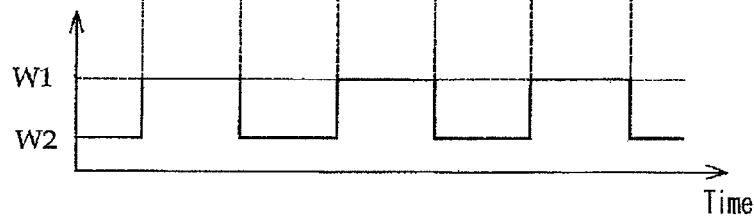
FIG. 4C shows a variation of a duty ratio of a switching element Q2 in FIG. 3. (SIC).

The electric current control circuit 6 controls the electric current output circuit 5 so that waveforms of the driving electric current outputted from the electric current output circuit 5 become rectangular waves of a type that the term t1 during which the driving electric current becomes the maximum value I1 and the term t2 during which the driving electric current becomes the minimum value I2 appear alternately, as shown in FIG. 4A. Hereupon, a period of the driving electric current is given by t1+t2, and a frequency (1/(t1+t2)) thereof is preferably several hundred Hz (more preferably, 200 Hz).

The processing unit 61 adjusts lengths or a ratio of the terms t1 and t2 so as not to vary the frequency of the driving electric current (to satisfy a condition t1+t2=constant) responding to light control signals inputted from an external apparatus (not illustrated) such as a remote controller or an adjuster. For example, when a light control signal to increase the brightness of the light source 1 is inputted, the processing unit 61 lengthens the term t1 and shortens the term t2 than before. Alternatively, when a light control signal to decrease the brightness of the light source 1 is inputted, the processing unit 61 shortens the term t1 and lengthens the term t2 than before.

Subsequently, an operation of the light control apparatus 2 in the first embodiment is described. When the light control apparatus 2 starts the operation, the electric current control circuit 6 controls the electric current output circuit 5 so that the maximum value I1 and the minimum value I2 of the driving electric current and the terms t1 and t2 become predetermined values respectively, and thus, the light source 1 is lit at a brightness responding to a mean value of the driving electric current outputted from the electric current output circuit 5. When a light control signal to increase the brightness of the light source is inputted to the electric current control circuit 6 from an external apparatus, the electric current control circuit 6 increases the mean value of the driving electric current by lengthening the term t1 and shortening the term t2 than before so as to light the light source 1 brightly. On the other hand, when a light control signal to decrease the brightness of the light source is inputted to the electric current control circuit 6 from the external apparatus, the electric current control circuit 6 decreases the mean value of the driving electric current by shortening the term t1 and lengthening the term t2 than before so as to light the light source 1 darkly.

Figure 8:
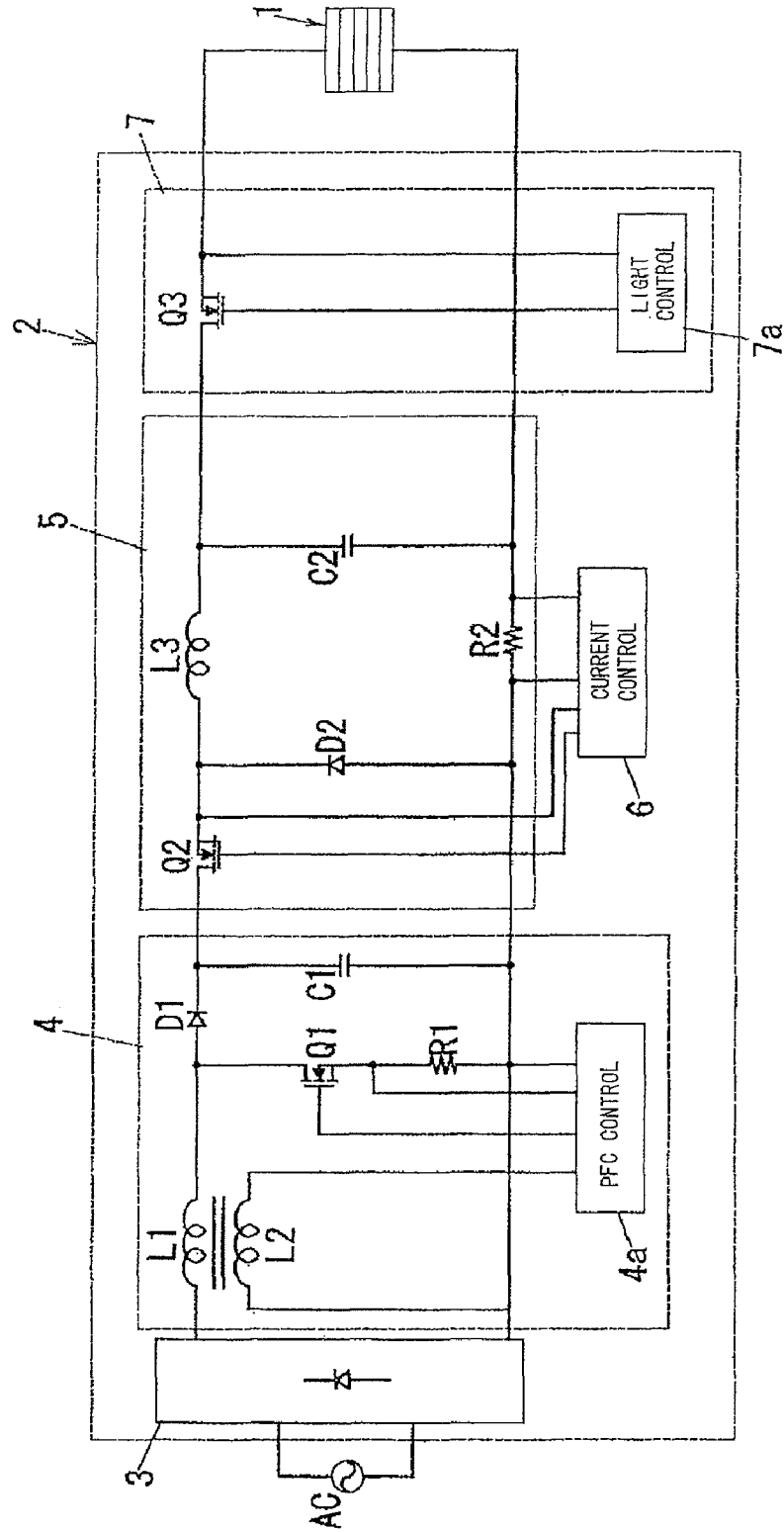
FIG. 8 is a circuit diagram showing a constitution of a conventional light control apparatus.
Figure 9A:
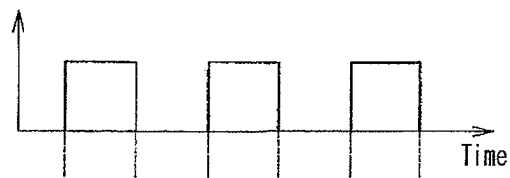
FIG. 9A is a timing chart showing a variation of voltage applied to a gate of a switching element Q3 by a light control unit 6a in the above conventional light control device.
Figure 9B:
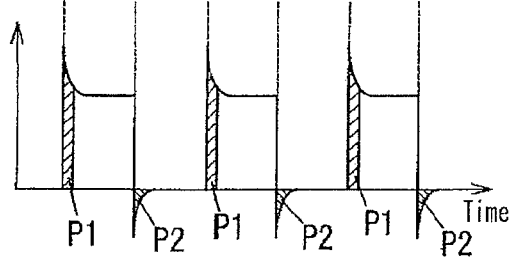
FIG. 9B is a timing chart showing constant electric current intermittently flowing in a light source 1 by ON/OFF control of the switching element Q3 in the above conventional light control apparatus.

In this way, according to the light control apparatus 2 in the first embodiment, the driving electric current of a component of the electric current I2 due to the biasing direct current voltage V2 flows in the light source 1 at all times in the light control of the light source 1, as shown in FIG. 4A, feeding of the electric power to the light source 1 is never stopped different from the case of performing the light control of the light source 1 by the PWM control like the conventional one. Therefore, when a capacitive component of the organic EL device is once charged, charge and discharge to the organic EL device are not performed in the light control different from the conventional one, so that luminous efficiency can be increased. In addition, the light source 1 is never extinguished in the light control, the brightness of the organic EL device immediately varies responding to the variation of the driving electric current, so that rising-up of light flux of the light source can be made precipitous, brightness of light emission of the lighting appliance using this light control apparatus can be increased, and flicker of the light source 1 can be decreased. Moreover, surge electric currents due to charge and discharge of the capacitive component do not flow repeatedly in the organic EL device, so that stress loaded on the organic EL device is reduced and an operation life of the light source can be elongated. Moreover, the light control of the light source 1 is performed by oscillating the driving electric current, so that a circuit for PWM control such as a switch for switching on and off of a feeding line between the electric current output circuit 5 and the light source 1 and a control unit (for example, a light control circuit 7 in FIG. 8) for controlling the switch becomes unnecessary, and thus, it is possible to simplify a circuit configuration and to reduce a cost thereof.

In addition, although the processing unit 61 in the first embodiment is configured to adjust the terms t1 and t2 so as not to vary the frequency of the driving electric current (to satisfy the condition t1+t2=constant), it is not necessarily to make the frequency of the driving electric current constant. For example, when the light control signal to increase the brightness of the light source is inputted, it is possible to lengthen only the term t1 and to remain the term t2 as it is or to shorten only the term t2 and to remain the term t1 as it is. Alternatively, it is possible to lengthen the term t1 and to shorten the term t2 without satisfying the condition t1+t2=constant. In addition, when the light control signal to decrease the brightness of the light source is inputted, it is possible to shorten only the term t1 or to lengthen only the term t2, or to shorten the term t1 and to lengthen the term t2 simultaneously. In other words, it is sufficient that the electric current control circuit 6 is configured to vary the length of at least one of the term t1 during which the driving electric current becomes the maximum value I1 and the term t2 during which the driving electric current becomes the minimum value I2 in one period of an amplitude of the driving electric current.

In addition, it is possible to perform the light control of the light source 1 by varying at least one of the maximum value I1 and the minimum value I2 of the driving electric current instead of varying at least one of the terms t1 and t2 in one period of the amplitude of the driving electric current. For example, it is possible to increase the maximum value I1 and the minimum value I2 of the driving electric current when the light control signal to increase the brightness of the light source is inputted, and to decrease the maximum value I1 and the minimum value I2 of the driving electric current when the light control signal to decrease the brightness of the light source is inputted.

In addition, it is not necessary to vary both of the maximum value I1 and the minimum value I2 of the driving electric current, and it is preferable to vary at least one of the maximum value I1 and the minimum value I2. For example, the processing unit 61 may be configured so that the maximum value I1 of the driving electric current is set to a constant value, and the minimum value I2 is increased when the light control signal to increase the brightness of the light source 1 is inputted and the minimum value I2 is decreased when the light control signal to decrease the brightness of the light source 1 is inputted. Alternatively, the processing unit 61 may be configured so that the minimum value I2 of the driving electric current is set to a constant value, and the maximum value I1 is increased when the light control signal to increase the brightness of the light source 1 is inputted and the maximum value I1 is decreased when the light control signal to decrease the brightness of the light source 1 is inputted. In other words, the electric current control apparatus 6 may be one that varies at least one of the maximum value I1 and the minimum value I2 of the driving electric current to perform the light control of the light source 1.

Alternatively, the electric current control circuit 6 may be configured to vary both of the lengths or ratio of the term t1 and the term t2 during which the driving electric current becomes the maximum value I1 and the minimum value I2, and the maximum value I1 and/or the minimum value I2 of the driving electric current for light control of the light source 1.

In summary, the electric current control circuit 6 may be configured to perform the light control of the light source 1 by adjusting at least one of four parameters of the term t1 during which the driving electric current becomes the maximum value I1, the term t2 during which the driving electric current becomes the minimum value I2, the maximum value I1 of the driving electric current and the minimum value I2 of the driving electric current.

In addition, although the depression chopper circuit is exemplified for the electric current output circuit 5, the electric current output circuit 5 is not limited to the depression chopper circuit, a direct electric current source which enables to flow an electric current of a predetermined intensity to the light source 1 may be used. In addition, the lighting appliance shown in FIGS. 1A and 1B is an embodiment of the present invention, and it is not intended to limit the present invention to the embodiment, and modification may be acceptable in a scope not to divagate the gist of the present invention. The same goes for a second embodiment described below.

Second Embodiment

Figure 5:
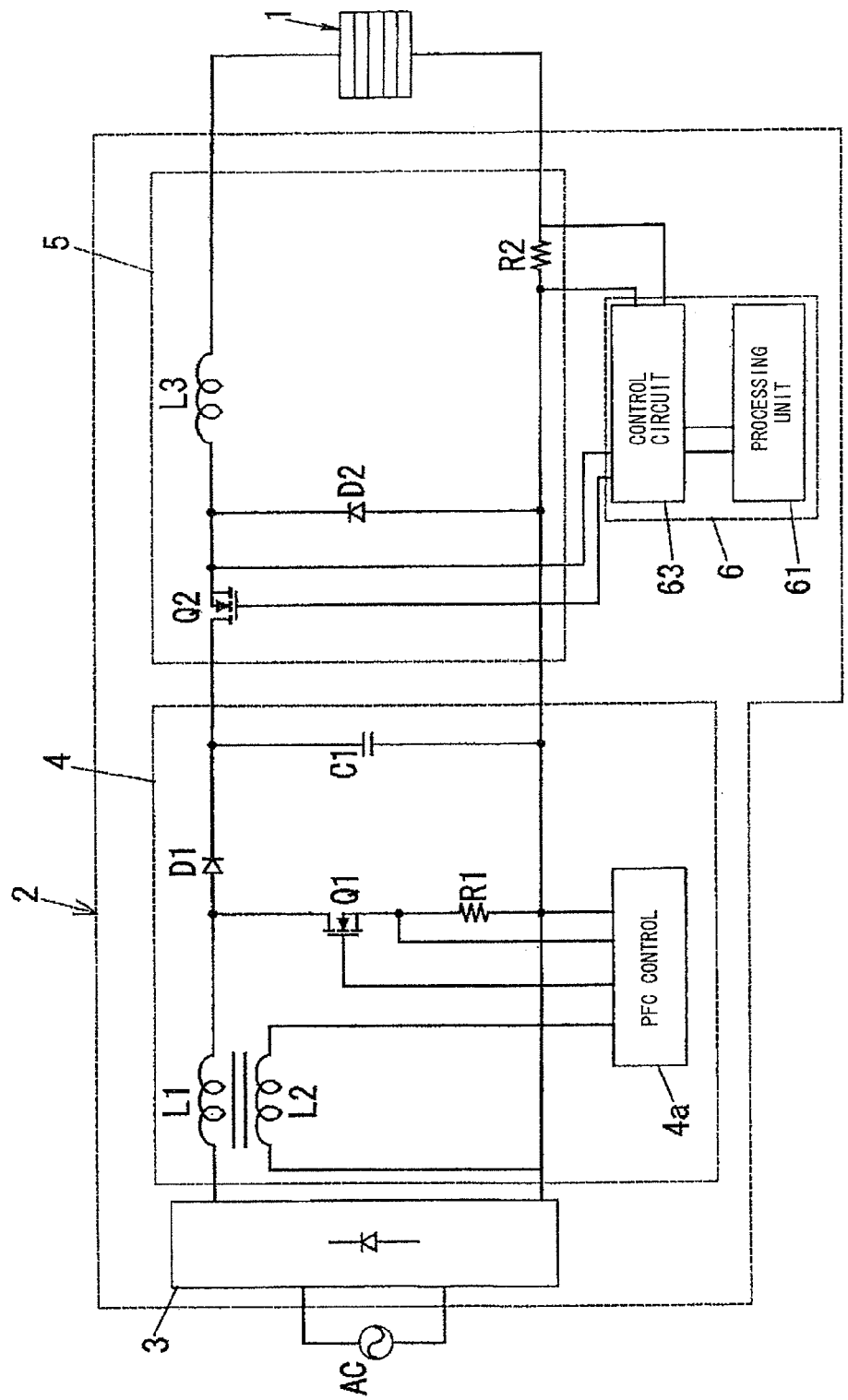
FIG. 5 is a circuit diagram showing a constitution of a light control apparatus 2 in a second embodiment of the present invention.
Figure 6:
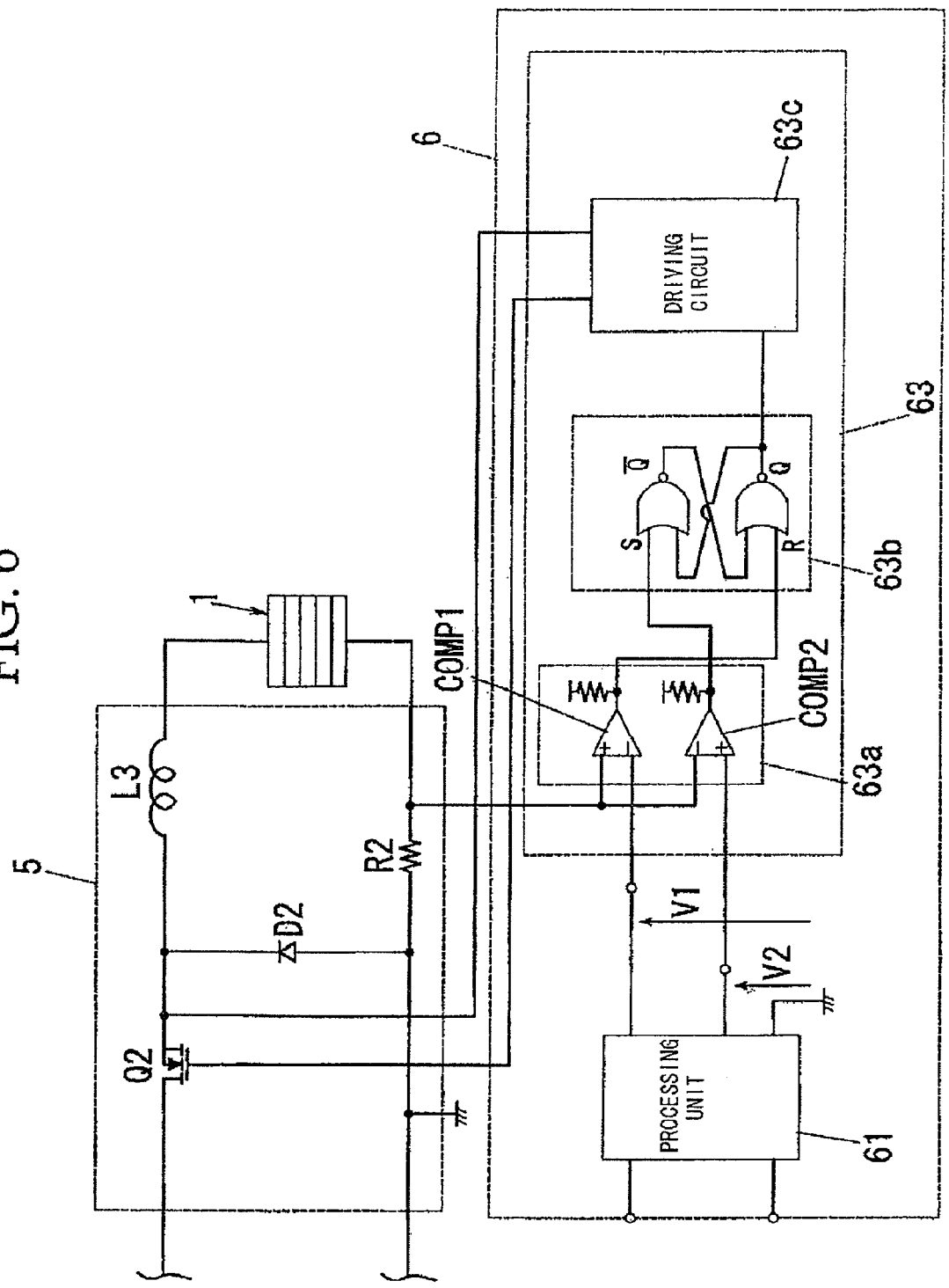
FIG. 6 is a circuit diagram showing a concrete constitution of an electric current control circuit 6 of the light control apparatus in the second embodiment.

Subsequently a light control apparatus and a lighting appliance using the same in accordance with a second embodiment of the present invention are described. In the second embodiment, configurations of an electric current output circuit 5 and as electric current control circuit 6 are different from those in the first embodiment, as shown in FIG. 5 and FIG. 6. The other constitution is the same as that in the first embodiment, the same elements are designated by the same symbols, and thus, the description of them is omitted.

The electric current output circuit 5 in the second embodiment does not comprise a smoothing capacitor 2. In addition, the electric current control circuit 6 is constituted by a control circuit unit 63 for performing ON/OFF control of a switching element Q2 and a processing unit 61. The control circuit unit 63 is constituted by a comparator circuit 63a configured of a pair of a first comparator COPM1 and a second comparator COMP2, a logic circuit 63b configured of an SR-type flip-flop circuit such as a pair of NOR gates, and a driving circuit 63c for switching on and off the switching element Q2 responding to outputs from the logic circuit 63b.

A noninversion input terminal of the first comparator COMP 1 of the comparator circuit 63a is connected to a point between a resistor R2 and a light source 1, and a voltage between both ends of the resistor R2 is inputted to the noninversion input terminal. An inversion input terminal of the first comparator COMP 1 is connected to the processing unit 61, and a voltage V1 which is an upper limit of the voltage between both ends of the resistor R2 is inputted to the inversion input terminal from the processing unit 61. Thus, the first comparator COMP1 outputs a high level signal when the voltage between both ends of the resistor R2 exceeds the voltage V1. On the other hand, an inversion input terminal of the second comparator COMP2 is connected to the point between the resistor R2 and the light source 1, and the voltage between both ends of the resistor R2 is inputted to the inversion input terminal. A noninversion input terminal of the second comparator COMP2 is connected to the processing unit 61, and a voltage V2 (>0) which is a lower limit of the voltage between both ends of the resistor R2 is inputted thereto from the processing unit 61. Thus, the second comparator COMP2 outputs a high level signal when the voltage between both ends of the resistor R2 falls short of the voltage V2.

The logic circuit 63b is the SR-type flip-flop circuit as mentioned above, and has a truth table shown in table 1.

TABLE 1

| S | R | Q | $\overline{Q}$ |
|---|---|---|---|
| 0 | 0 | HOLD | |
| 0 | 1 | 0 | 1 |
| 1 | 0 | 1 | 0 |
| 1 | 1 | RESTRICTION | |

A set terminal (S-terminal) of the logic circuit 63b is connected to an output terminal of the second comparator COMP2 of the comparator circuit 63a, a reset terminal (R-terminal) is connected to an output terminal of the first comparator COMP 1 of the comparator circuit 63a, and an output terminal (Q-terminal) is connected to the driving circuit 63c.

The driving circuit 63c outputs a high level signal to a gate of the switching element Q2 when the truth value of the output terminal is "1" so as to switch on the switching element Q2. In addition, the driving circuit 63c outputs a low level signal to the gate of the switching element Q2 when the truth value of the output terminal is "0" so as to switch off the switching element Q2.

Figure 7:
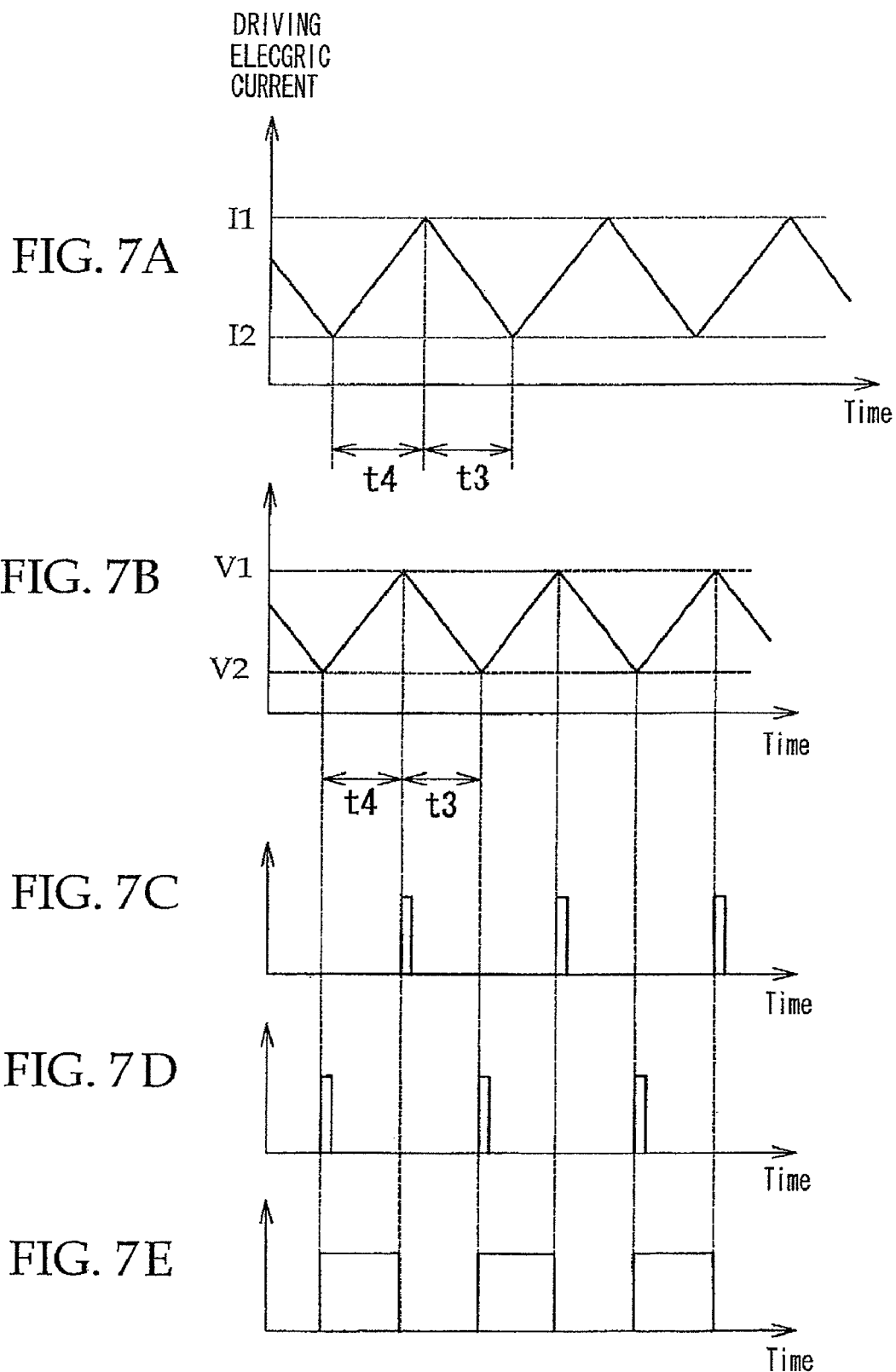
FIG. 7A is a timing chart showing a variation of a driving electric current flowing in a light source 1 in the second embodiment.
FIG. 7B is a timing chart showing a variation of a voltage between both ends of a resistor R2 in FIG. 6.
FIG. 7C is a timing chart showing a variation of an output of a first comparator COMP1 in FIG. 6.
FIG. 7D is a timing chart showing a variation of an output of a second comparator COMP2 in FIG. 6.
FIG. 7E is a timing chart showing a variation of a gate voltage of a switching element Q2 in FIG. 6.

Subsequently, a motion of the control circuit unit 63 is described with reference to FIG. 7. FIG. 7A shows a variation of a driving electric current flowing, FIG. 7B shows a variation of the voltage between both ends of the resistor R2, FIG. 7C shows a variation of the output of the first comparator COMP1, FIG. 7D shows a variation of the output of the second comparator COMP2, and FIG. 7E shows a variation of the gate voltage of the switching element Q2.

At first, it is assumed that the voltage between both ends of the resistor R2 is a value larger than the lower limit value V2 and smaller than the upper limit value V1 in an initial state, as shown in FIG. 7B, and the switching element Q2 is switched off. In case that the switching element Q2 is switched off, no driving electric current flows to the light source 1, and the voltage between both ends of the resistor R2 degreases in time, as shown in FIG. 7B. Later on, when the voltage between both ends of the resistor R2 falls short of the lower limit value V2, the output of the second comparator COMP2 becomes high level, as shown in FIG. 7D, and a truth value "1" is inputted to the set terminal of the logic circuit 63$b$. At this time, since the output of the first comparator COMP1 is low level, as shown in FIG. 7C, the output of the output terminal of the logic circuit 63$b$ becomes the truth value "1", and thus, the driving circuit 63$c$ outputs a high level signal to the gate of the switching element Q2 so as to switch on the switching element Q2, as shown in FIG. 7E. Thereby, the value of the driving electric current flowing in the light source increases, as shown in FIG. 7A, and the voltage between both ends of the resistor R2 increases, as shown in FIG. 7B. Hereupon, since the electric current output circuit 5 comprises a coil L3, the driving electric current does not increase precipitous even when the switching element Q2 is switched on, and thus, it gradually increases. In addition, when the voltage between both ends of the resistor R2 exceeds the lower limit value V2, the output of the second comparator COMP2 becomes low level, however, the output of the output terminal of the logic circuit 63$b$ is remained as the truth value "1", as shown in the table 1.

When the voltage between both ends of the resistor R2 increases and exceeds the upper limit value V1, the output of the first comparator COMP1 becomes high level, as shown in FIG. 7C, and the truth value "1" is inputted to the reset terminal of the logic circuit 63$b$. At this time, since the output of the second comparator COMP2 is low level, as shown in FIG. 7D, the output of the output terminal of the logic circuit 63$b$ becomes the truth value "0", and thus, the driving circuit 63$c$ outputs a low level signal to the gate of the switching element Q2 so as to switch off the switching element Q2, as shown in FIG. 7D. Thereby, the value of the driving electric current flowing in the light source 1 decreases, as shown in FIG. 7A, and the voltage between both ends of the resistor R2 decreases. Since the electric current output circuit 5 comprises the coil L3 as mentioned above, the driving electric current does not decrease precipitous even when the switching element Q2 is switched off, and thus, it gradually decreases. In addition, when the voltage between both ends of the resistor R2 falls short of the upper limit value V1, the output of the first comparator COMP1 becomes low level, however, the output of the output terminal of the logic circuit 63$b$ is remained as the truth value "0", as shown in the table 1.

Subsequently, by repeating the operations that the switching element Q2 is switched on when the voltage between both ends of the resistor R2 falls short of the lower limit value V2 and the switching element Q2 is switched on when the voltage between both ends of the resistor R2 exceeds the upper limit value V1, waveforms of the voltage between both ends of the resistor R2 become pyramidal waves that the upper limit value V1 and the lower limit value V2 appear alternately, as shown in FIG. 7B.

Therefore, waveforms of the driving electric current flowing in the light source 1 become pyramidal waves that a value I1 of electric current when the voltage between both ends of the resistor R2 is the upper limit value V1 and a value I2 of electric current when the voltage between both ends of the resistor R2 is the lower limit value V2 appear alternately, as shown in FIG. 7A. Hereupon, the value I1 of electric current is the maximum value of the driving electric current defined by the value of the resistor R2 and the upper limit value V1 of the voltage between both ends thereof, and it is selected to be about 0.3 A, as an example, which is a value not to give any stress to (not to affect the operative life of) the light source 1. On the other hand, the value I2 of electric current (I2<I1) is the minimum value of the driving electric current defined by the value of the resistor R2 and the lower limit value V2 thereof, and it is selected to be about 50 mA (more preferably, equal to or larger than 100 mA), as an example, which is a value equal to or larger than the smallest value of the electric current enabling to maintain the lighting of the light source 1. In addition, these values are merely the examples and it is not limited to these values.

By the way, when a term that the driving electric current is transitive to the minimum value I2 from the maximum value I1 is designated by t3 and a term that the driving electric current is transitive to the maximum value I1 from the minimum value I2 is designated by t4, a period of the driving electric current is given by t3+t4, and a frequency (1/(t3+t4)) is preferably several hundred Hz (more preferably, 200 Hz).

The processing unit 61 performs the light control of the light source 1 by adjusting intensities the upper limit value V1 and the lower limit value V2 of the voltage of both ends of the resistor R2 responding to light control signals inputted from an external apparatus (not illustrated) such as a remote controller or an adjuster. For example, when a light control signal to increase the brightness of the light source 1 is inputted, the processing unit 61 increases both of the upper limit value V1 and the lower limit value V2 of the voltage between both ends of the resistor R2 than before so as to increase both of the maximum value I1 and the minimum value I2 of the driving electric current. On the other hand, when a light control signal to decrease the brightness of the light source 1 is inputted, the processing unit 61 decreases both of the upper limit value V1 and the lower limit value V2 of the voltage between both ends of the resistor R2 than before so as to decrease both of the maximum value I1 and the minimum value I2 of the driving electric current.

Subsequently, an operation of the light control apparatus 2 in the second embodiment is described. When the light control apparatus 2 starts the operation, the electric current control circuit 6 controls the electric current output circuit 5 so that the maximum value I1 and the minimum value I2 of the driving electric current become predetermined values respectively, and thus, the light source 1 is lit at a brightness responding to a mean value of the driving electric current outputted from the electric current output circuit 5. When a light control signal to increase the brightness of the light source 1 is inputted to the electric current control circuit 6 from an external apparatus, the electric current control circuit 6 increases both of the maximum value I1 and the minimum value I2 of the driving electric current than the values before so as to increase the mean value of the driving electric current, and thus to lit the light source 1 brightly than before. On the other hand, when a light control signal to decrease the brightness of the light source 1 is inputted to the electric current control circuit 6 from the external apparatus, the electric current control circuit 6 decreases both of the maximum value I1 and the minimum value I2 of the driving electric current than the values before so as to decrease the mean value of the driving electric current, and thus to lit the light source 1 darkly than before.

In this way, according to the light control apparatus 2 and a lighting appliance using the light control apparatus 2 in the second embodiment, the driving electric current flows in the light source 1 at all times in the light control, so that it works on the same effect as the above mentioned first embodiment.

By the way, although the electric current control circuit 6 in the second embodiment is configured to perform the light control of the light source 1 by varying the maximum value I1 and the minimum value I2 of the driving electric current, it is not necessary to vary both of the maximum value I1 and the minimum value I2, and at least one of the maximum value I1 and the minimum value I2 should be varied. For example, the electric current control circuit 6 may be configured to set the maximum value I1 as a fixed vale, to increase only the minimum value I2 of the driving electric current when the light control signal to increase the brightness of the light source 1 is inputted, and to decrease only the minimum value I2 of the driving electric current when the light control signal to decrease the brightness of the light source 1 is inputted. Alternatively, the electric current control circuit 6 may be configured to set the minimum value I2 as a fixed vale, to increase only the maximum value I1 of the driving electric current when the light control signal to increase the brightness of the light source 1 is inputted, and to decrease only the maximum value I1 of the driving electric current when the light control signal to decrease the brightness of the light source 1 is inputted. In other words, the electric current control circuit 6 may be configured to fix one of the maximum value I1 and the minimum value I2 of the driving electric current and to vary the other.

In addition, the electric current control circuit 6 may be configured to perform the light control of the light source 1 by varying the term t3 that the driving electric current is transitive to the minimum value I2 from the maximum value I1 and the term t4 that the driving electric current is transitive to the maximum value I1 from the minimum value I2 instead of varying the intensity of the driving electric current. For example, when the light control signal to increase the brightness of the light source 1 is inputted, the electric current control circuit 6 shortens at least one of the term t3 and the term t4 to shorten the period (t3+t4) of the driving electric current, and when the light control signal to decrease the brightness of the light source 1 is inputted, the electric current control circuit 6 lengthens at least one of the term t3 and the term t4 to lengthen the period (t3+t4) of the driving electric current. In other words, the electric current control circuit 6 may be configured to vary at least one of the term t3 that the driving electric current is transitive to the minimum value I2 from the maximum value I1 and the term t4 that the driving electric current is transitive to the maximum value I1 from the minimum value I2 in light control of the light source 1.

Alternatively, the electric current control circuit 6 may be configured to vary at least one of the term t3 that the driving electric current is transitive to the minimum value I2 from the maximum value I1 and the term t4 that the driving electric current is transitive to the maximum value I1 from the minimum value I2 and at least one of the maximum value I1 and the minimum value I2 of the driving electric current simultaneously in light control of the light source 1.

In summary, the electric current control circuit 6 may be configured to perform the light control of the light source 1 by adjusting at least one of four parameters of the term t3 that the driving electric current is transitive to the minimum value I2 from the maximum value I1, the term t4 that the driving electric current is transitive to the maximum value I1 from the minimum value I2, and the maximum value I1 and the minimum value I2 of the driving electric current.

This application is based on Japanese patent application 2007-248105 filed in Japan, the contents of which are hereby incorporated by references of the specification and drawings of the above patent application.

In addition, although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

The invention claimed is:

1. A light control apparatus comprising: an electric current output circuit which outputs a constant electric current for lighting a light source configured of an organic electroluminescence device; and an electric current control circuit for controlling an intensity of a driving electric current outputted from the electric current output circuit, wherein
the electric current control circuit biases a direct electric current component so that the driving electric current periodically varies between a predetermined maximum value and a predetermined minimum value and flows in the same direction at all times in light control of the light source.

2. The light control apparatus in accordance with claim 1, wherein the electric current control circuit fixes a maximum value or a minimum value of the driving electric current and varies the other when performing the light control of the light source.

3. The light control apparatus in accordance with claim 1, wherein the electric current control circuit varies at least one of a term during which the driving electric current becomes the maximum value and another term during which the driving electric current becomes the minimum value in a period of variation of the driving electric current when performing the light control of the light source.

4. The light control apparatus in accordance with claim 1, wherein the electric current control circuit controls the electric current output circuit so that waveforms of the driving electric current become rectangular waves.

5. The light control apparatus in accordance with claim 1, wherein the electric current control circuit varies a length of at least one of a term that the driving electric current is transitive to the minimum value from the maximum value and another term that the driving electric current is transitive to the maximum value from the minimum value when performing the light control of the light source.

6. The light control apparatus in accordance with claim 1, wherein the electric current control circuit controls the electric current output circuit so that waveforms of the driving electric current become pyramidal waves.

7. A lighting appliance comprising a light control apparatus, a light source constituted by an organic electroluminescence device and a casing containing the light control apparatus and the light source, wherein
the light control apparatus comprises:
an electric current output circuit which outputs a constant electric current for lighting a light source configured of an organic electroluminescence device; and an electric current control circuit for controlling an intensity of a driving electric current outputted from the electric current output circuit, wherein
the electric current control circuit biases a direct electric current component so that the driving electric current periodically varies between a predetermined maximum value and a predetermined minimum value and flows in the same direction at all times in light control of the light source.

8. The lighting appliance in accordance with claim 7, wherein the electric current control circuit fixes a maximum value or a minimum value of the driving electric current and varies the other when performing the light control of the light source.

9. The lighting appliance in accordance with claim 7, wherein the electric current control circuit varies at least one of a term during which the driving electric current becomes the maximum value and another term during which the driving electric current becomes the minimum value in a period of variation of the driving electric current when performing the light control of the light source.

10. The lighting appliance in accordance with claim 7, wherein the electric current control circuit controls the electric current output circuit so that waveforms of the driving electric current become rectangular waves.

11. The lighting appliance in accordance with claim 7, wherein the electric current control circuit varies a length of at least one of a term that the driving electric current is transitive to the minimum value from the maximum value and another term that the driving electric current is transitive to the maximum value from the minimum value when performing the light control of the light source.

12. The lighting appliance in accordance with claim 7, wherein the electric current control circuit controls the electric current output circuit so that waveforms of the driving electric current become pyramidal waves.

* * * * *